United States Patent [19]

Denlinger et al.

[11] 4,173,768
[45] Nov. 6, 1979

[54] CONTACT FOR SEMICONDUCTOR DEVICES

[75] Inventors: Edgar J. Denlinger, East Windsor; Harold S. Veloric, Morristown, both of N.J.

[73] Assignee: RCA Corporation, New York, N.Y.

[21] Appl. No.: 869,642

[22] Filed: Jan. 16, 1978

[51] Int. Cl.$^2$ .................. H01L 23/48; H01L 29/44; H01L 29/52
[52] U.S. Cl. ...................... 357/68; 357/65; 357/67; 357/54
[58] Field of Search .............. 357/65, 67, 68, 71, 357/54

[56] References Cited
U.S. PATENT DOCUMENTS

| | | | |
|---|---|---|---|
| 2,885,571 | 5/1959 | Williams et al. | 357/68 |
| 3,373,481 | 3/1968 | Lins et al. | 357/68 |
| 3,432,920 | 3/1969 | Rosenzweig | 357/68 |
| 3,653,898 | 4/1972 | Shaw | 357/68 |
| 4,017,886 | 4/1977 | Tomono et al. | 357/68 |

Primary Examiner—Andrew J. James
Attorney, Agent, or Firm—H. Christoffersen; D. S. Cohen

[57] ABSTRACT

A contact on a surface of a semiconductor device includes a post projecting from the surface of the device and a head on the post. The post has a transverse cross-sectional shape of at least three arms projecting radially from a common center point. The head has a cross-sectional area larger than the transverse cross-sectional area of the post. The post is on the surface of a body of semiconductor material and extends through a layer of an inorganic insulating material, such as an oxide or nitride, on the surface of the body. The post is of a height such that the head is spaced from the inorganic insulating material layer. A layer of an organic insulating material, such as a polyimide or silicone resin, may be provided on the inorganic insulating material layer and around the post to provide additional support for the head.

8 Claims, 3 Drawing Figures

CONTACT FOR SEMICONDUCTOR DEVICES

The present invention relates to a contact for a semiconductor device and particularly to such a contact which can have a small area of contact with the semiconductor device but a larger area to which a conductor can make engagement.

Many semiconductor devices have small active areas at the surface of the semiconductor body forming the device. In order to electrically connect such small active areas to either other active areas of the same semiconductor device or to other devices in a circuit, it is desirable to have a contact for the device which has a portion which is small enough to engage the small active area and a portion which is large enough for easy electrical connection thereto. A contact which has been used for this purpose is a mushroom shape contact, such as shown in U.S. Pat. No. 3,476,984 to G. J. Tibol, issued Nov. 4, 1969 entitled "Schottky Barrier Semiconductor Device." This type of contact generally includes a cylindrical post having a small cross sectional area which engages the active area of the devices and a larger head which projects beyond the post. The post generally extends through an opening in a layer of an inorganic insulating layer which is on the surface of the semiconductor body and the head projects over and engages the surface of the insulating layer so as to be supported by the insulating layer. A problem with this type of contact is that the portion of the head of the contact which projects beyond the post and over the insulating layer provides a capacitance effect with the semiconductor body, with the insulating layer being the dielectric. This capacitance effect can adversely affect the operating characteristics of the semiconductor device. Attempts to reduce this capacitance effect by making this post longer so that the head is spaced further from the semiconductor body and is spaced from the insulating layer have not been satisfactory since such contacts are physically weak because of the small size of the stem. Thus such contacts are subject to being damaged by physical abuse.

Figure 1:
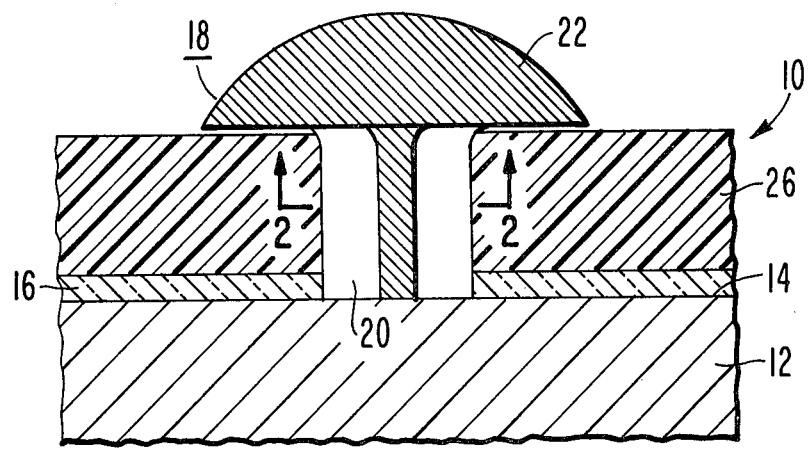
FIG. 1 is a transverse sectional view of a portion of a semiconductor device which includes one form of the contact of the present invention.

Referring initially to FIG. 1, a semiconductor device which utilizes the contact of the present invention is generally designated as 10. The semiconductor device 10 includes a body 12 of semiconductor material, such as silicon, gallium arsenide or the like, having a surface 14. On the surface 14 of the body 12 is a thin layer 16 of an inorganic insulating material, such as silicon dioxide, silicon nitride or the like.

Figure 2:
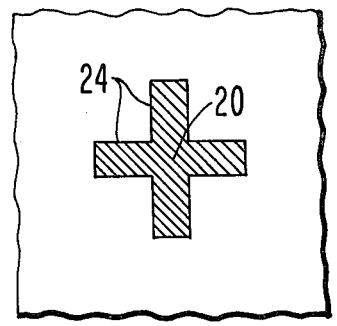
FIG. 2 is a cross-sectional view taken along line 2—2 of FIG. 1.

A contact 18 of an electrically conductive material, such as gold, copper or the like, is on the surface 14 of the semiconductor body 12 and projects therefrom. The contact 18 includes a post 20 and a head 22 on the post. As shown in FIG. 2, the transverse cross-sectional shape of the post 20 is in the form of a plurality of arms 24 projecting radially from a common center point. As shown there are four arms arranged in the shape of a cross. However, the post 20 can have as few as three arms and more than four arms. The head 22 is preferably circular in transverse cross-section and is substantially larger than the post 20 so as to project radially beyond the post 20. The post 20 engages the surface 14 of the semiconductor body 12 so as to be electrically connected to the semiconductor body and projects through an opening in the inorganic insulating layer 16. The height of the post 20 is substantially greater than the thickness of the inorganic insulating layer 16 so that the head 22 is substantially spaced from the inorganic insulating layer 16 as well as from the surface 14 of the semiconductor body 12.

By forming the post 20 of a plurality of the arms 24 projecting radially from a common center point, the post can be made with a very small cross-sectional area, yet the arms will provide the post with rigidity so that it can be made relatively long. For example, each of the arms can be made as small as about 12 microns long and 5 microns wide and the post can be made long enough so that the head 22 is spaced from the inorganic insulating layer 16 by about 10 microns. The post 20 needs at least three of the arms 24 to provide the desired rigidity. The fewer the number of arms, the smaller the cross-sectional area, but the larger the number of arms, the greater the strength of the post. A post having four arms arranged in the form of a cross is preferred as providing a good combination of small area and strength. Thus, the contact 18 has a post 20 of small cross-sectional area so as to be able to engage a small active surface area of the semiconductor body 12 and a relatively large area head 22 to which connections can be easily made. In addition, the post 20 rigidly supports the head 22 spaced from the inorganic insulating layer 16 so as to greatly reduce any capacitance effect between the head 22 and the semiconductor body 12.

If desired a layer 26 of an organic insulating material, such as a polymide, silicone or similar resin can be provided on the inorganic insulating layer 14 and around the post 20 of the contact 18. The organic insulating layer 26 will provide additional support for the contact 18 and has a low dielectric constant so that it will not cause an increase in the capacitive effect between the head 22 of the contact 18 and the semiconductor body 12. As will be explained later, the use of the organic insulating layer 26 has additional advantages in making electrical connections between a plurality of contacts 18 on a single semiconductor device.

The contact 18 is formed by first forming the desired semiconductor device in the semiconductor body 12. A thin metal contact layer of the shape and size desired for the cross-sectional shape of the post 20 is formed on the surface 14 of the semiconductor body 12. This can be achieved by coating the entire semiconductor body surface 14 with a metal layer, forming a patterned layer of a resist material over the portion of the metal layer to be retained using standard photolithographic techniques, and then removing the uncovered portion of the metal layer, such as with a suitable etchant. The inorganic insulating layer 16 is then formed, such as by pyrolytic deposition from a gas, on the surface 14 of the semiconductor body and around the metal contact layer. A thin film of a conductive metal is then formed over the inorganic insulating layer and the metal contact layer to serve as a contact for a later plating operation. A layer of a photoresist material is then coated over the thin metal layer with the photoresist layer being of a thickness corresponding to the desired spacing between the head 22 and the inorganic insulating layer 16. Using standard photolithographic techniques an opening is formed in the photoresist layer that matches the size and shape of and overlies the metal contact layer. The contact 18 is then completed by plating the material of the contact on the exposed metal contact layer. The plating is continued until the metal completely fills the opening in the photoresist layer to form the post 20 of the contact. As the plating is continued, the area of the metal plated on the post will spread out radially to form the head 22 over the surface of the photoresist layer. When a head 22 of the desired area is formed the plating is stopped. The photoresist layer can then be removed with a suitable solvent. After the photoresist layer is removed, the thin metal film is removed with a suitable etchant and the organic insulating layer 26 can be applied using a standard spinning operation. The organic insulating layer 26 is then cured by heating it at the appropriate temperature for the particular material used.

Figure 3:
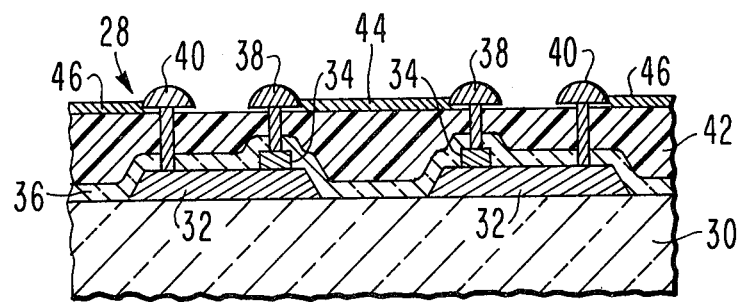
FIG. 3 is a sectional view of an integrated circuit which utilizes the contact of the present invention.

Referring to FIG. 3, an integrated circuit semiconductor device, i.e., a semiconductor device having more than one semiconductor element, which includes contacts of the present invention, is generally designated as 28. The integrated circuit semiconductor device 28 includes a substrate 30 of an insulating material, such as sapphire, spinel or insulating gallium arsenide, having bodies 32 of a semiconductor material, such as silicon or gallium arsenide, on a surface thereof. On each of the semiconductor material bodies 32 is a small region 34 of a semiconductor material. A layer of an inorganic insulating material 36 extends over each of the semiconductor material bodies 32, semiconductor material regions 34 and the portions of the surface of the substrate 30 which are not covered by the semiconductor material bodies 32. A separate contact 38 of a structure such as the contact 18 shown in FIGS. 1 and 2 is on each of the semiconductor material bodies 32 and extends through the inorganic insulating layer 36. A separate metal contact 40 engages each of the semiconductor material bodies 32 and extends through the insulating layer 36. The post of each of the contacts 38 and 40 are of a length so that the heads of the contacts are spaced from the insulating layer 36 and are in the same plane.

A layer 42 of an organic insulating material is over the inorganic insulating material layer 36 and surrounds and engages the posts of the contacts 38 and 40. The organic insulating material layer 42 is of a thickness such that the heads of the contacts 38 and 40 are at the surface of the organic insulating material layer 42. A strip 44 of an electrically conductive material is on the surface of the organic insulating material layer 42 and extends between and engages the heads of the two contacts 38. Separate strips 46 of a conductive material are on the surface of the organic insulating material layer 42 with each conductive strips 46 engaging the head of a separate contact 40.

Each body 32 of semiconductor material with its semiconductor material region 34 and contacts 38 and 40 form a separate semiconductor element. For example, the semiconductor element may be a diode with the semiconductor body 32 and semiconductor region 34 being of opposite conductivity type to form a PN junction therebetween. Alternatively, the contact 38 may form a surface barrier junction with the semiconductor material region 34 to form the diode. The conductive strip 44 would then connect the two semiconductor elements together. The conductive strips 46 could be used to connect each of the semiconductor elements to either other semiconductor elements which form a portion of the integrated circuit device 28 or to terminals of the device. Thus in the integrated circuit device 28 the organic insulating material layer 42 not only serves to help support the contacts 38 and 40 but also supports the conductors for interconnecting the various elements of the devices. By using the contacts of the present invention the area of engagement between the contacts and the semiconductor material bodies is small so that the contacts can be placed closed together. This permits a large number of elements to be formed on the substrates 30.

What is claimed is:

1. A semiconductor device comprising
a body of semiconductor material having a surface,
a metal contact on said surface, said contact including
a post projecting from the surface of the semiconductor body and a head on the post, said post having a transverse cross-sectional shape of at least three arms projecting radially from a common center point and the head having a surface area greater than the transverse cross-sectional area of the post.

2. A semiconductor device in accordance with claim 1 including a layer of an inorganic insulating material on the surface of the semiconductor body, the post extending through an opening in said inorganic insulating material layer and the head being spaced from the inorganic insulating material layer.

3. A semiconductor device in accordance with claim 2 in which the opening in the inorganic insulating material layer corresponds in shape and size to the transverse cross-sectional shape of the post.

4. A semiconductor device in accordance with claim 3 in which the post has four arms arranged in the form of a cross.

5. A semiconductor device in accordance with claim 3 including a layer of an organic insulating material on the inorganic insulating material layer and surrounding and engaging the post of the contact.

6. A semiconductor device in accordance with claim 5 in which the organic insulating material layer is of a thickness substantially equal to the distance between the head of the contact and the inorganic insulating material layer.

7. A semiconductor device in accordance with claim 6 in which the organic insulating material layer is of a polyimide resin.

8. A semiconductor device in accordance with claim 6 including a plurality of said contacts in spaced relation and each extending through the inorganic insulating material layer to engage the surface of a semiconductor body, and a conductive strip on the organic insulating material layer extending between and contacting the heads of at least two of the contacts so as to electrically connect the two contacts.

* * * * *